United States Patent
Chuang et al.

(10) Patent No.: US 9,355,956 B2
(45) Date of Patent: May 31, 2016

(54) INDUCTOR FOR SEMICONDUCTOR INTEGRATED CIRCUIT

(71) Applicant: Taiwan Semiconductor Manufacturing Co., LTD., Hsinchu (TW)

(72) Inventors: Hao-Hsiang Chuang, Taipei (TW); Jeng-Shien Hsieh, Kaohsiung (TW); Chuei-Tang Wang, Taichung (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 68 days.

(21) Appl. No.: 14/070,105

(22) Filed: Nov. 1, 2013

(65) Prior Publication Data
US 2015/0123759 A1 May 7, 2015

(51) Int. Cl.
*H01F 5/00* (2006.01)
*H01F 27/28* (2006.01)
*H01L 23/522* (2006.01)
*H01F 17/00* (2006.01)
*H01L 49/02* (2006.01)

(52) U.S. Cl.
CPC ........ *H01L 23/5227* (2013.01); *H01F 17/0013* (2013.01); *H01L 23/5225* (2013.01); *H01F 2017/002* (2013.01); *H01F 2017/0086* (2013.01); *H01L 23/5226* (2013.01); *H01L 28/10* (2013.01)

(58) Field of Classification Search
CPC .................................. H01F 5/00; H01F 27/28
USPC .................................................. 336/200, 232
See application file for complete search history.

(56) References Cited

U.S. PATENT DOCUMENTS

| | | | | |
|---|---|---|---|---|
| 3,614,554 | A * | 10/1971 | Shield et al. | 257/531 |
| 7,355,264 | B2 * | 4/2008 | Degani et al. | 257/531 |
| 2003/0043010 | A1 * | 3/2003 | Yeo et al. | 336/200 |
| 2008/0001698 | A1 * | 1/2008 | Hazucha et al. | 336/200 |
| 2008/0198560 | A1 * | 8/2008 | Fujiwara et al. | 361/728 |
| 2010/0026368 | A1 * | 2/2010 | Tang et al. | 327/361 |
| 2011/0090036 | A1 * | 4/2011 | Kuroda | 336/199 |

FOREIGN PATENT DOCUMENTS

JP 05291063 A * 11/1993

OTHER PUBLICATIONS

Yue, C. Patrick; et al., "Physical Modeling of Spiral Inductors on Silicon"; IEEE Transactions on Electron Devices, vol. 47, No. 3, Mar. 2000; pp. 560-568.
Vroubel, Marina; et al., "Integrated Tunable Magnetic RF Inductor"; IEEE Electron Device Letters, vol. 25, No. 12, Dec. 2004; pp. 787-789.

* cited by examiner

*Primary Examiner* — Tsz Chan
(74) *Attorney, Agent, or Firm* — Maschoff Brennan

(57) ABSTRACT

An inductor includes a plurality of first conductive lines, a plurality of second conductive lines and a plurality of contacts. Each of the first conductive lines is spaced apart from one another. Each of the second conductive lines is spaced apart from one another, and each of the second conductive lines crosses over each of the first conductive lines. Each of the contacts electrically interconnects one of the first conductive lines and one of the second conductive lines. These contacts are arranged in a way such that at least parts of the first conductive lines and at least parts of the second conductive lines form an electric current path serving as an inductor.

20 Claims, 15 Drawing Sheets

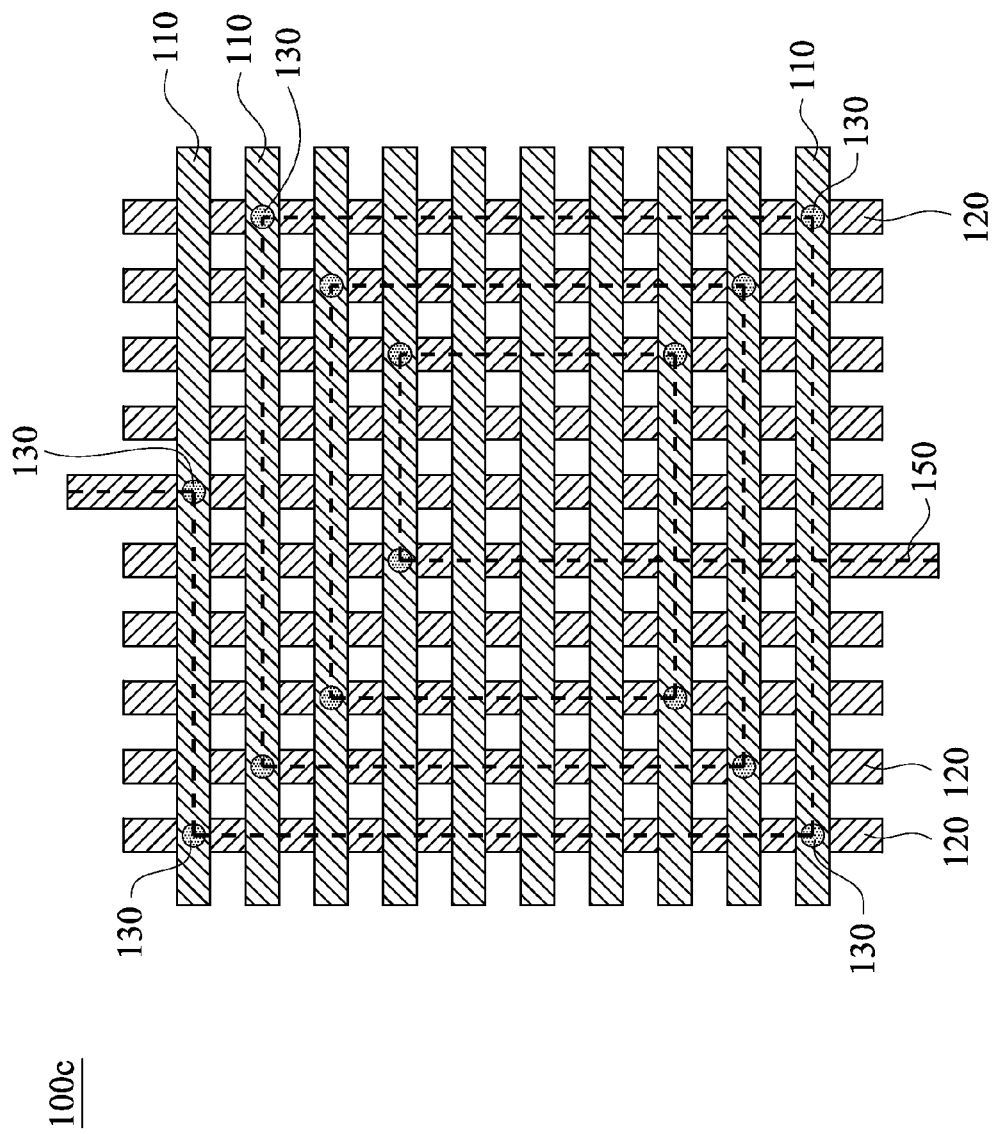

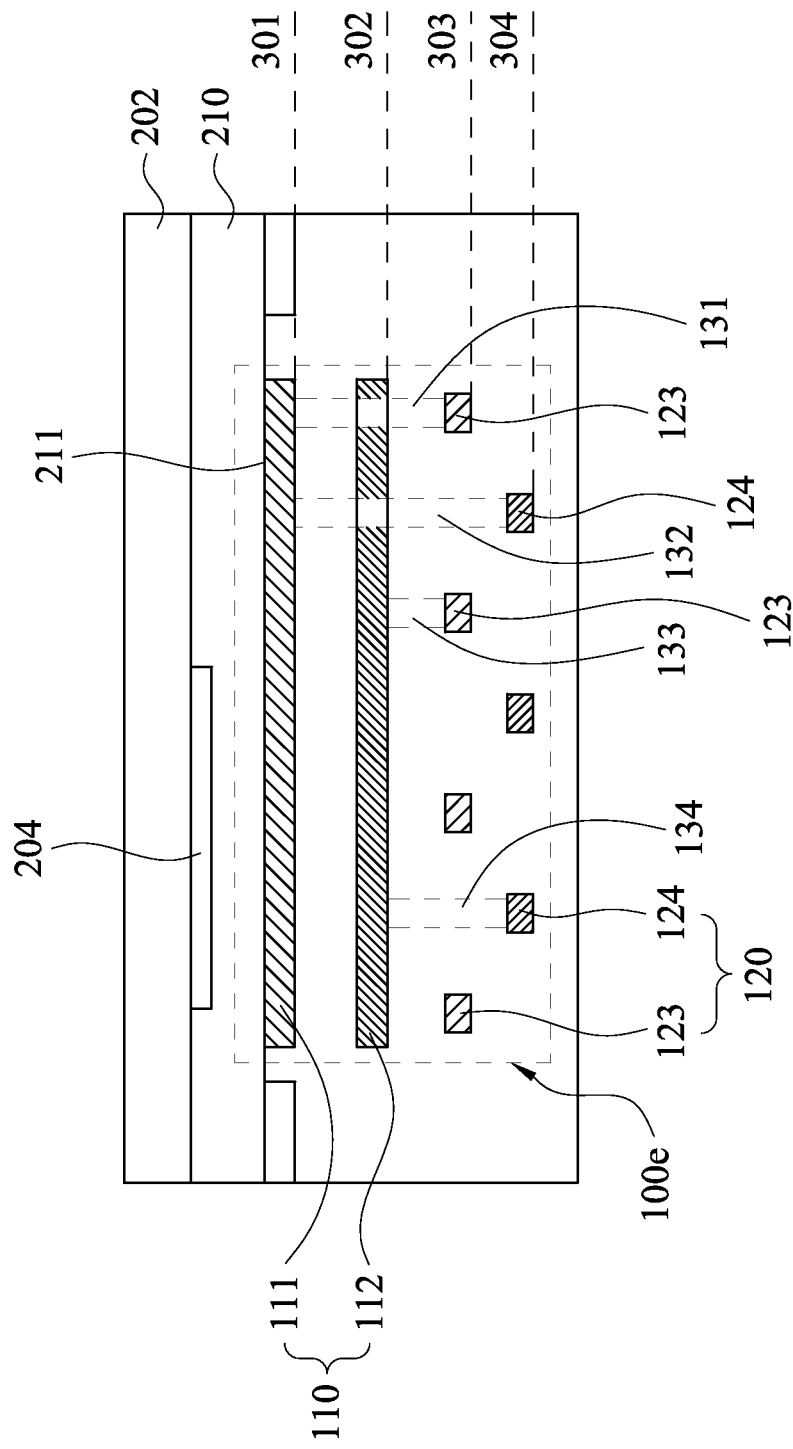

INDUCTOR FOR SEMICONDUCTOR INTEGRATED CIRCUIT

BACKGROUND

In semiconductor integrated circuits, inductors and transformers are key components commonly used by designers and manufactures. For instance, the inductors are utilized for the purpose of widening the frequency band and/or of matching the impedance. Generally, the inductor for a semiconductor integrated circuit has a spiral-like conductive line formed on a plane. The impendence of the inductor depends upon the turning number and the occupied area of the spiral-like conductive line. The impendences of inductors are easily affected by some causes such as process variation and packaging structures, and therefore the actual impendences of inductors probably depart from the design values.

BRIEF DESCRIPTION OF THE DRAWINGS

The disclosure can be more fully understood by reading the following detailed description of the embodiments, with reference made to the accompanying drawings as follows:

FIG. 2A to FIG. 2D are top views schematically illustrating inductors according to various embodiments of the present disclosure;

FIG. 3A and FIG. 3B are respectively a cross-sectional view and a top view schematically illustrating an inductor according to various embodiments of the present disclosure;

DETAILED DESCRIPTION

Figure 1A:
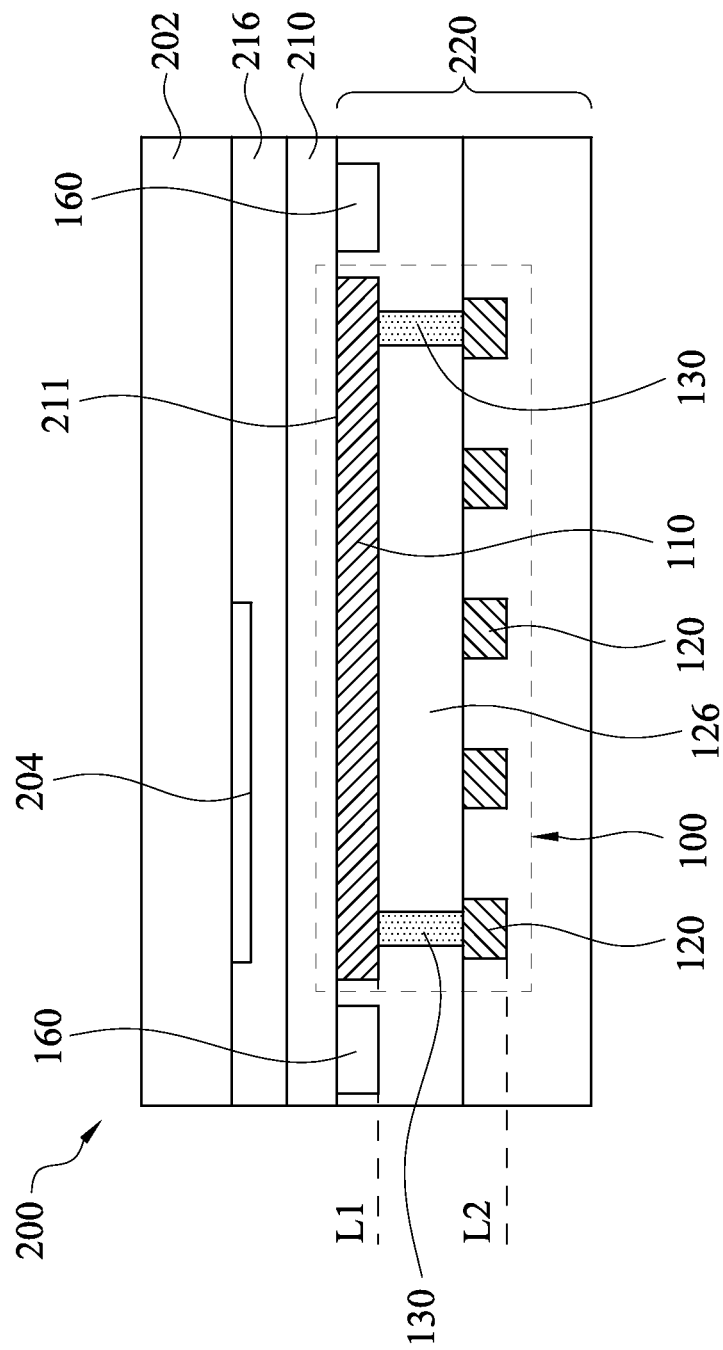
FIG. 1A and FIG. 1B are respectively a cross-sectional view and a top view schematically illustrating an inductor according to various embodiments of the present disclosure.

In the following detailed description, for purposes of explanation, numerous specific details are set forth in order to provide a thorough understanding of the disclosed embodiments. It will be apparent, however, that one or more embodiments may be practiced without these specific details. In the drawings, the thickness and width of layers and regions may be exaggerated for clarity. Like reference numerals in the drawings denote like elements. The elements and regions illustrated in the figures are schematic in nature, and thus relative sizes or intervals illustrated in the figures are not intended to limit the scope of the present disclosure.

The present disclosure relates generally to inductors for electrical circuitry. Specific examples of components and arrangements are described below to simplify the present disclosure. These are, of course, merely examples and are not intended to be limiting. For instance, the formation of a first feature over or on a second feature in the description may include embodiments in which the first and second features are formed in direct contact, and may also include embodiments in which additional features may be formed between the first and second features, such that the first and second features may not be in direct contact. Additionally, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "below," "beneath," "above," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1B:
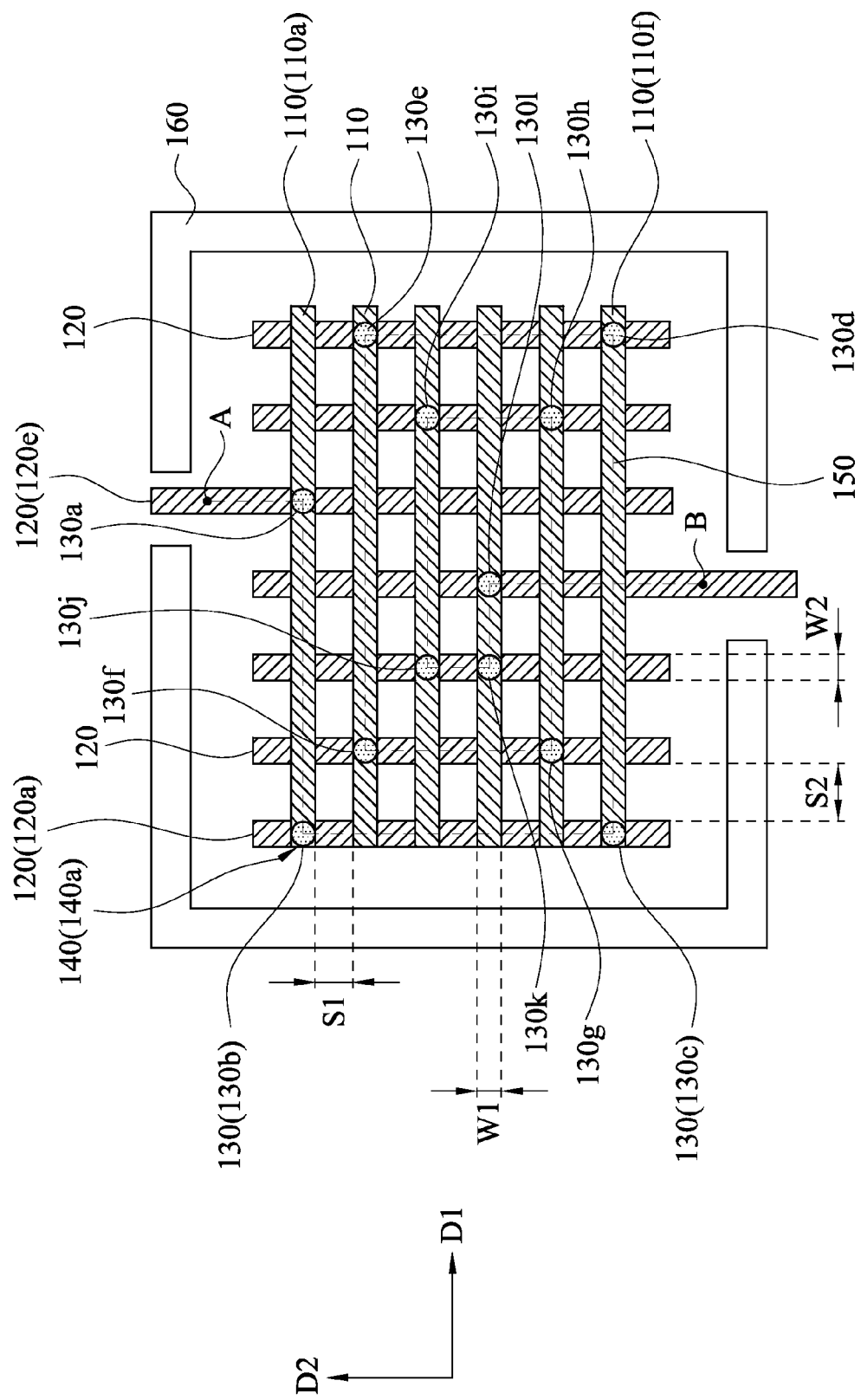
Figure 1C:
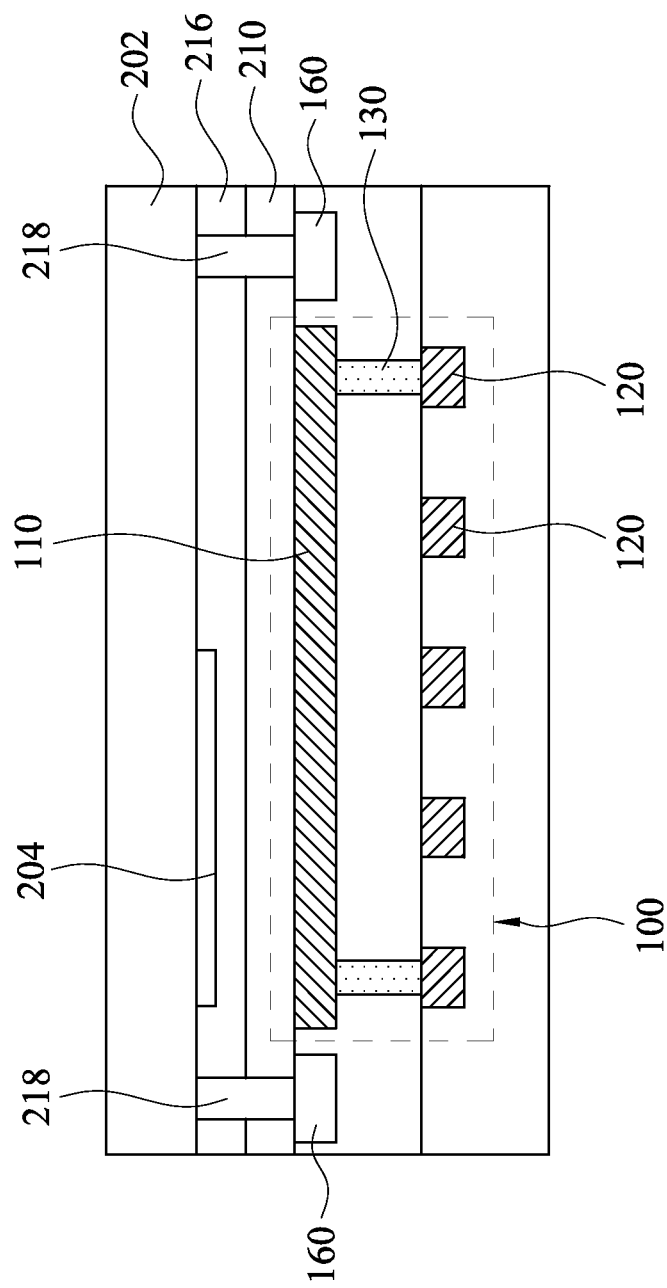
FIG. 1C is a cross-sectional view schematically illustrating an inductor according to some embodiments of the present disclosure.
Figure 2A:
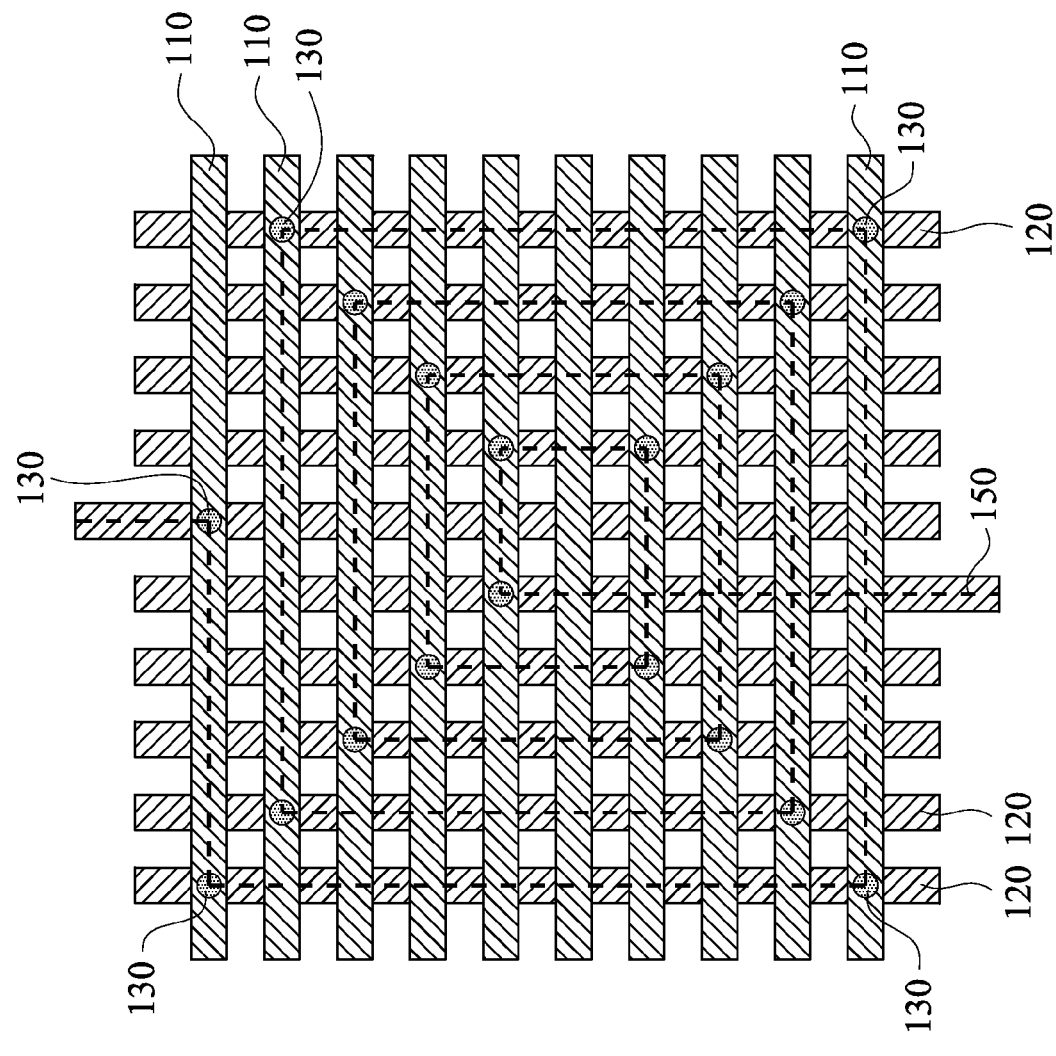
Figure 2B:
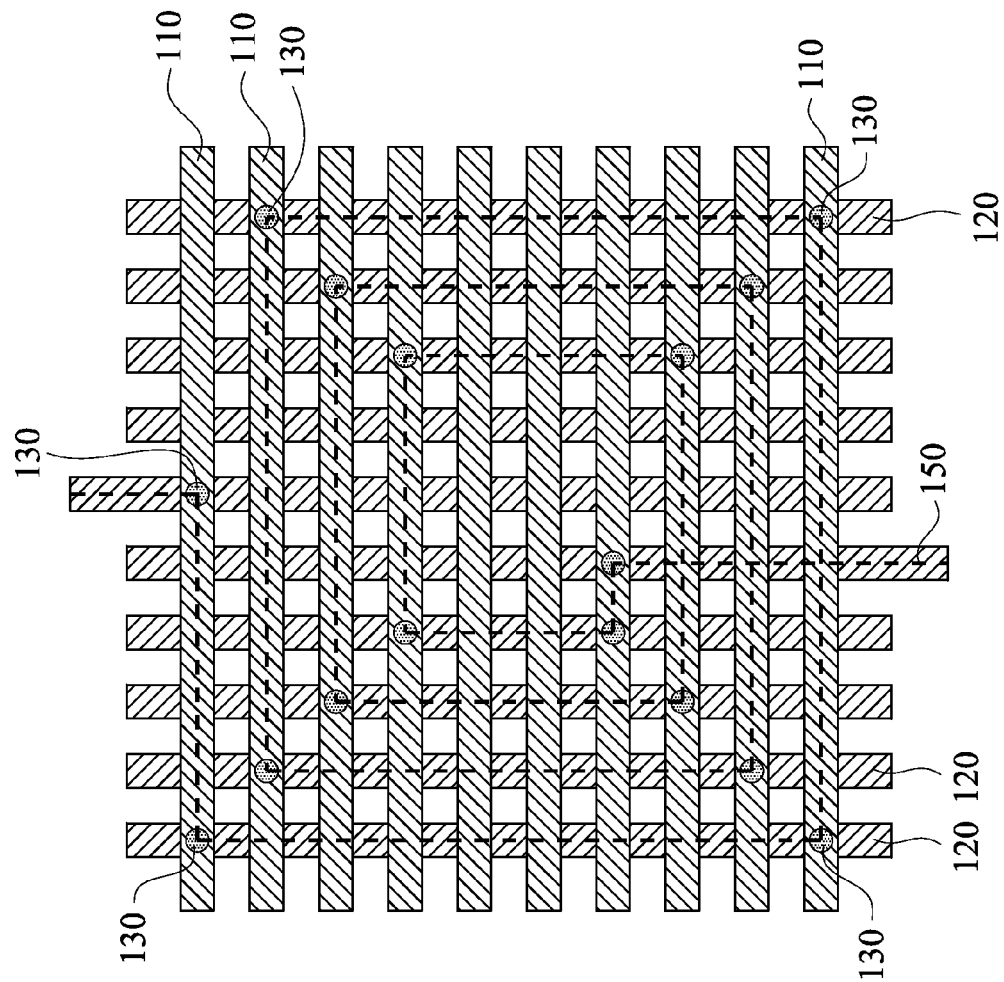
Figure 2D:
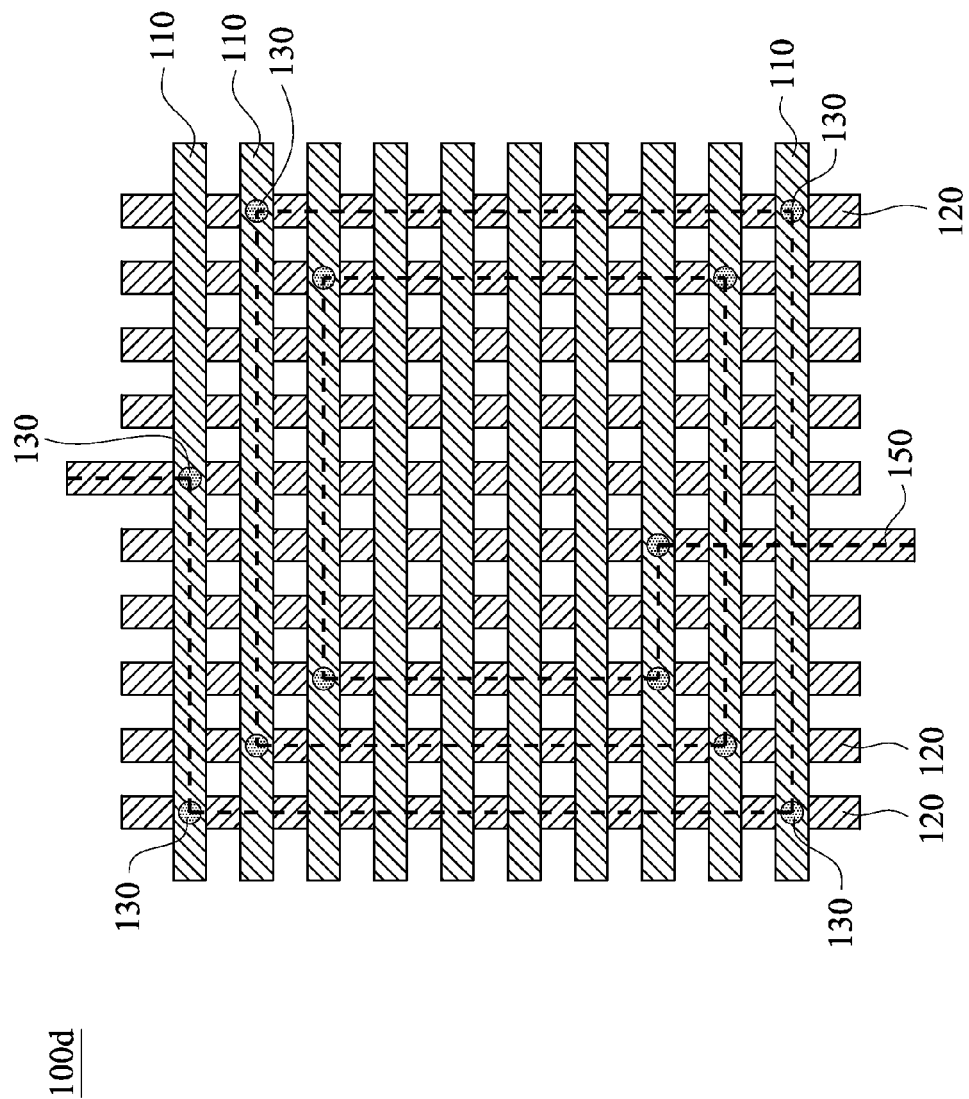

FIG. 1A and FIG. 1B are respectively a cross-sectional view and a top view schematically illustrating an inductor 100 according to various embodiments of the present disclosure. As shown in FIG. 1A, the inductor 100 is formed in a semiconductor substrate 200, which includes a bulk substrate 202, circuitry 204, a passivation layer 210 and a post-passivation interconnect (PPI) structure 220. Particularly, the bulk substrate 202 may include, for example, a silicon wafer, a semiconductor-on-insulator (SOI) substrate or a silicon germanium substrate, on which the circuitry 204 and the passivation layer 210 are formed. The PPI structure 220 is formed over the passivation layer 210, and may includes elements such as signal lines, capacitors, fan-in lines, fan-out lines and/or redistribution layer (RDL) structures. As shown in FIG. 1A and FIG. 1B, the inductor 100 is formed in the PPI structure 220 of the semiconductor substrate 200, and includes a plurality of first conductive lines 110, a plurality of second conductive lines 120 and a plurality of contacts 130. In some embodiments, the semiconductor substrate 200 further includes an inter-metal dielectric (IMD) layer 216 formed between the passivation layer 210 and the bulk substrate 202.

The first conductive lines 110 are arranged at a first level L1 with respect to a reference surface, such as for example a surface 211 of the passivation layer 210, as shown in FIG. 1A. Each of the first conductive lines 110 is spaced apart from another one of the first conductive lines 110, as illustrated in FIG. 1B. In some embodiments, the first conductive lines 110 are parallel with each other and each of the first conductive lines 110 extends in a first direction D1. In yet some embodiments, the first conductive lines 110 are arranged at a substantially equal interval S1. Furthermore, each of the first conductive lines 110 has a substantially identical width W1.

One skilled in the art will appreciate that the above embodiments are provided for illustrative purposes only and are not meant to limit the present disclosure in any manner. For example, the first conductive lines 110 may be arranged at different intervals, or the first conductive lines 110 may be not parallel with each other. Furthermore, each of the first conductive lines 110 may be a curved conductive line although the first conductive lines 110 depicted in FIG. 1A are illustrated as straight lines.

The second conductive lines 120 are arranged at a second level L2 with respect to the reference surface, in which the second level L2 is different from the first level L1. As shown in FIG. 1A, one or more dielectric layers 126 may be formed between the first conductive lines 110 and the second conductive lines 120. The dielectric layer 126 may be made of, for example, a polymeric material such as benzocyclobutene (BCB), polybenzoxazole (PBO), polyimide, epoxy, and the like. In some examples, the dielectric layer 126 is formed of an inorganic material such as undoped silicate glass (USG), silicon nitride, silicon oxynitride, silicon oxide, and the like.

Each of the second conductive lines 120 crosses over each of the first conductive lines 110, as shown in FIG. 1B. Each of the second conductive lines 120 is spaced apart from another one of the second conductive lines 120. In some embodiments, the second conductive lines 120 are parallel with each other and each of the second conductive lines 120 extends in a second direction D2 that crosses the first direction D1. When the first direction D1 forms a right angle with the second direction D2, each of the second conductive lines 120 is orthogonal to each of the first conductive lines 110. The included angle between the first direction D1 and the second direction D2 may be a right angle, an obtuse angle or acute angle although FIG. 1A depicts that the first conductive lines 110 are orthogonal to the second conductive lines 120. In some embodiments, the second conductive lines 120 are arranged at a substantially equal interval S2, which is substantially the same as the interval S1 of the first conductive lines 110. Stated differently, the interval between adjacent ones of the first conductive lines 110 substantially equals the interval between adjacent ones of the second conductive lines 120. Nevertheless, the interval S2 is different from the interval S1 according to some embodiments of the present disclosure. In yet some embodiments, each of the second conductive lines 120 has a substantially identical width W2, which is substantially the same as the width W1 of each of the first conductive lines 110. One skilled in the art will appreciate that the above embodiments are provided for illustrative purposes only and are not meant to limit the present disclosure in any manner. For example, the second conductive lines 120 may be arranged at different intervals, or the second conductive lines 120 may be not parallel with each other. Furthermore, the second conductive lines 120 may include curved conductive lines although the second conductive lines 120 depicted in FIG. 1A are illustrated as straight lines.

Each of the contacts 130 is electrically interconnected between one of the first conductive lines 110 and one of the second conductive lines 120. Specifically, each of the contacts 130 is positioned at an intersection 140 of the one of the first conductive lines 110 and the one of the second conductive lines 120, as shown in FIG. 1B. For example, the contact 130b is positioned at the intersection 140a of the first and second conductive lines 110a, 120a, and electrically interconnects the first conductive line 110a with the second conductive line 120a. In some embodiments, the contacts 130 are via contacts formed in the dielectric layer 126 to interconnect one of the first conductive lines 110 and one of the second conductive lines 120, as shown in FIG. 1A. It is noted that the contacts 130 may be implemented by other means that are described hereinafter.

The contacts 130 are arranged in a way such that at least parts of the first conductive lines 110 and at least parts of the second conductive lines 120 form an electric current path 150 that serves as an inductor, as shown in FIG. 1B. In particular, electric current is transmitted from point A to point B through in sequence the contacts 130a, 130b, 130c, 130d, 130e, 130f, 130g, 130h, 130i, 130j, 130k, and 130l. More specifically, electric current is transmitted from point A to the contact 130b through the contact 130a and the first conductive line 110a. Further, electric current is transmitted from the contact 130b to the contact 130d through the second conductive line 120a, the contact 130c and the first conductive line 110f. Similarly, electric current may be transmitted from the contact 130d to point B through similar approaches mentioned above, and thus forming the electric current path 150. The electric current path 150 forms a spiral-like path and thereby functions as an inductor.

The contacts 130 are formed at some intersections of the first conductive lines 110 and the second conductive lines 120 such that the electric current path 150 is formed among the first and second conductive lines 110, 120. In some embodiments, each of the first and second conductive lines 110, 120 directly contacts one or two of the contacts 130 only. For instance, the second conductive lines 120e is in contact with the contact 130a only. The second conductive lines 120a is in contact with two contacts 130b, 130c only. In addition, current passes alternately through the first conductive lines 110 and the second conductive lines 120 and thereby forms the electric current path 150.

As shown in FIG. 1A and FIG. 1B, a ground ring 160 may be formed at the periphery of the inductor 100 to reduce electrical coupling with other components. The ground ring 160 may be positioned at a level the same as the first level L1 or the second level L2. In some embodiments, the ground ring 160 is coupled to a ground voltage of circuits (not shown) formed in the PPI structure 220.

In yet some embodiments, the ground ring 160 may be connected to the circuitry 204 through one ore more via contacts 218 through the passivation layer 210 and/or the IMD layer 216, as shown in FIG. 10.

FIG. 2A to FIG. 2D are top views schematically illustrating inductors 100a, 100b, 100c and 100d according to various embodiments of the present disclosure. Each of the inductors 100a, 100b, 100c and 100d is similar in structure except for the arrangement of the contacts 130. Specifically, the inductors 100a, 100b, 100c and 100d are provided with a different number of contacts 130, and therefore the inductors 100a, 100b, 100c and 100d each have a different electric current path 150. As a result, each of the inductors 100a, 100b, 100c and 100d exhibits a different inductance. Significantly, the inductors 100a, 100b, 100c and 100d have the same patterns of the first and second conductive lines 110, 120, and accordingly the inductance of each of the inductors depends upon the arrangement of the contacts 130. In other words, the inductance of the inductor may be easily modulated by modifying the layout pattern of the photomask that is used to form the contacts 130.

Figure 3B:
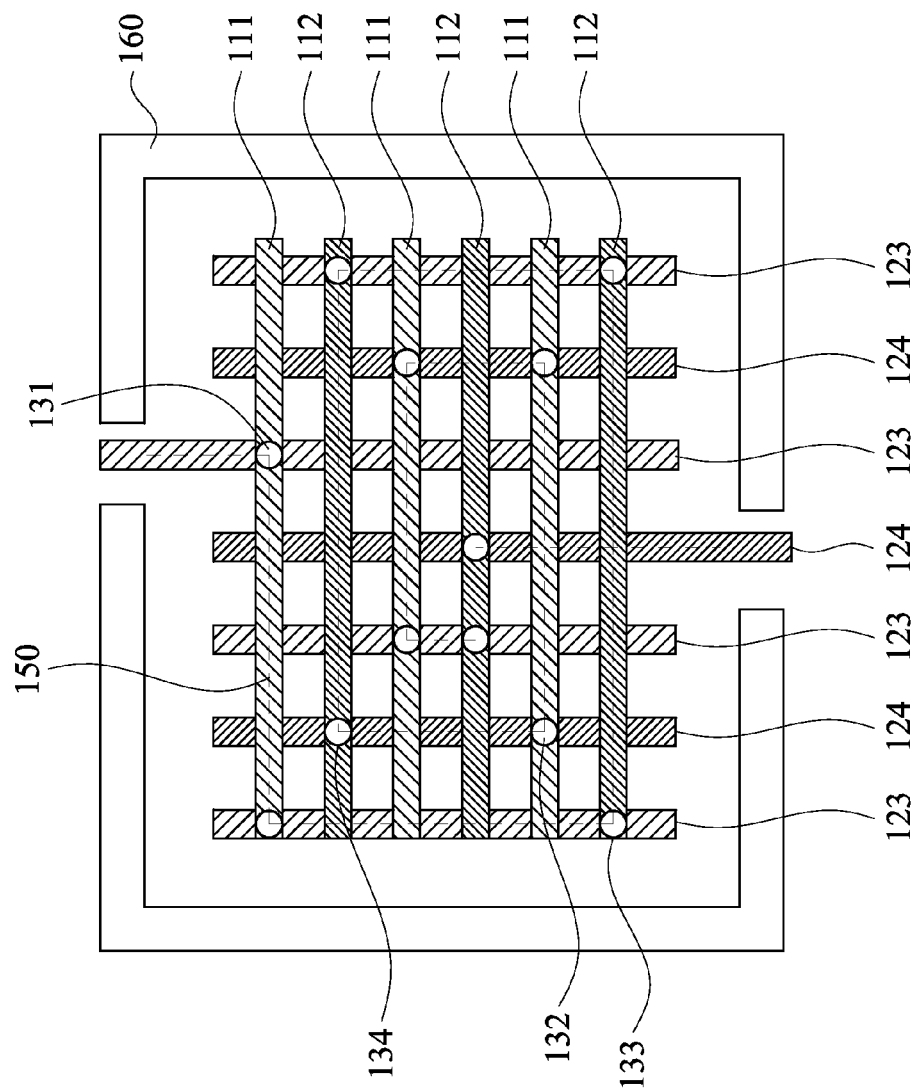

FIG. 3A and FIG. 3B are respectively a cross-sectional view and a top view schematically illustrating an inductor 100e according to some embodiments of the present disclosure. As shown in FIG. 3A and FIG. 3B, the first conductive lines 110 include a first subset of conductive lines 111 and a second subset of conductive lines 112. The first subset of conductive lines 111 is arranged at a level 301 with respect to a reference surface, such as the surface 211 of the passivation layer 210. The second subset of conductive lines 112 is arranged at a level 302 with respect to the reference surface, in which the level 302 is different from the level 301. For instance, one or more dielectric layers may be formed between the first subset of conductive lines 111 and the second subset of conductive lines 112. In some embodiments, as shown in FIG. 3B, the first subset of conductive lines 111 and the second subset of conductive lines 112 are substantially parallel to each other. Furthermore, the first subset of conductive lines 111 and the second subset of conductive lines 112 are alternately arranged.

In yet some embodiments, the second conductive lines 120 include a third subset of conductive lines 123 and a fourth subset of conductive lines 124. The third subset of conductive lines 123 is arranged at a level 303 with respect to the reference surface. The fourth subset of conductive lines 124 is arranged at a level 304 with respect to the reference surface, in which the level 304 is different from the level 303. In some embodiments, the third subset of conductive lines 123 and the fourth subset of conductive lines 124 are substantially parallel to each other. Furthermore, the third subset of conductive lines 123 and the fourth subset of conductive lines 124 are alternately arranged, as shown in FIG. 3B.

In some embodiments, as shown in FIG. 3A, the contacts include at least one first via contact 131, at least one second via contact 132, at least one third via contact 133 and at least one fourth via contact 134. The first via contact 131 is interconnected between one of the first subset of conductive lines 111 and one of the third subset of conductive lines 123. The second via contact 132 is interconnected between one of the first subset of conductive lines 111 and one of the fourth subset of conductive lines 124. The third via contact 133 is interconnected between one of the second subset of conductive lines 112 and one of the third subset of conductive lines 123. The fourth via contact 134 is interconnected between one of the second subset of conductive lines 112 and one of the fourth subset of conductive lines 124. These via contacts 131, 132, 133, 134 are arranged as illustrated in FIG. 3B such that parts of the conductive lines 111, 112, 123, 124 form an electric current path 150 serving as an inductor.

Figure 4A:
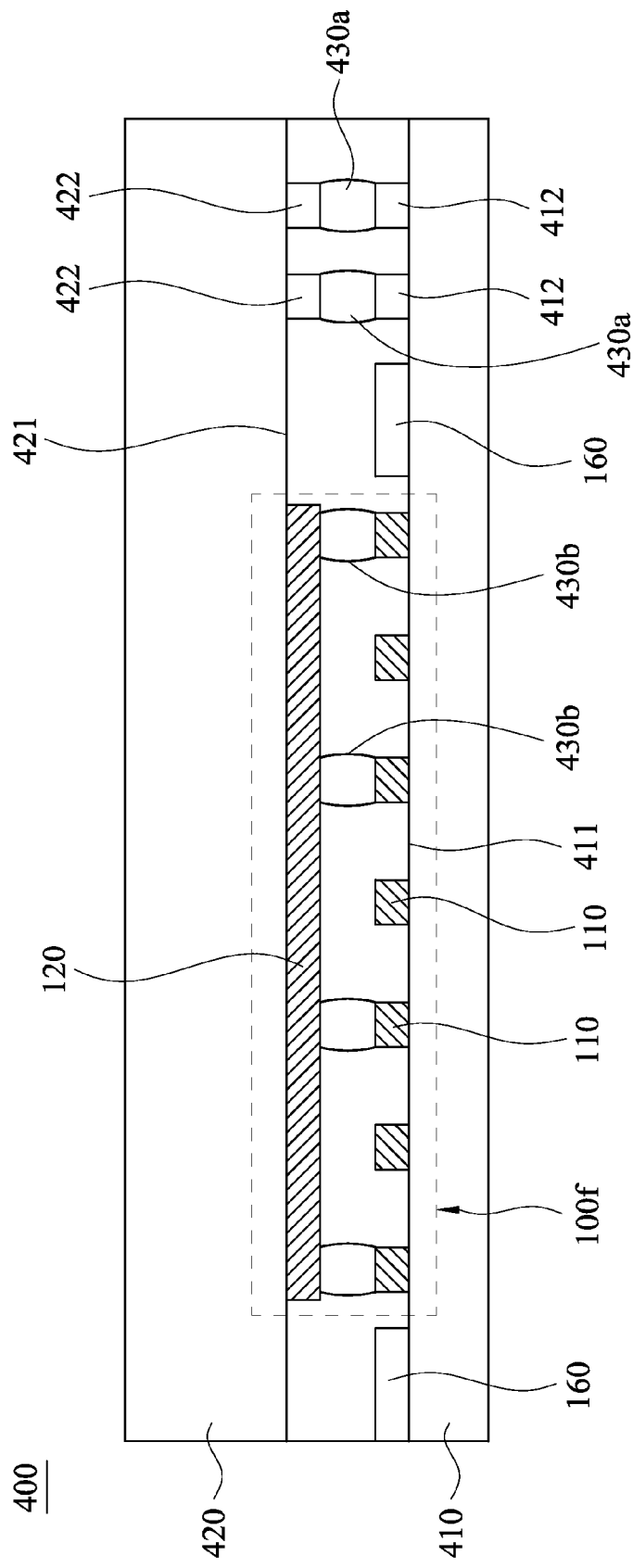
FIG. 4A, FIG. 4B and FIG. 4C are cross-sectional views schematically illustrating inductors formed in flip chip packages according to various embodiments of the present disclosure.

FIG. 4A is a cross-sectional view schematically illustrating an inductor 100f formed in a flip chip package 400 according to various embodiments of the present disclosure. The flip chip package 400 includes a package substrate 410, a semiconductor substrate 420 and a plurality of flip-chip bumps 430a. The semiconductor substrate 420, such as a flip chip, is provided with an under-bump metallurgy (UBM) layer 422, on which the flip-chip bumps 430a are disposed. Furthermore, the package substrate 410 has a plurality of pads 412 for contact with the flip-chip bumps 430a. In some embodiments, the package substrate 410 is an interposer substrate with electrical circuit formed therein. The semiconductor substrate 420 is electrically connected to the package substrate 410 through the flip-chip bumps 430a between the semiconductor substrate 420 and the package substrate 410.

The top view of the inductor 100f is similar to that depicted in FIG. 1B. Nevertheless, a portion of the inductor 100f is formed on the package substrate 410 whereas another portion of the inductor 100f is formed on the semiconductor substrate 420, as shown in FIG. 4A. The inductor 100f includes a plurality of first conductive lines 110, a plurality of second conductive lines 120 and a plurality of flip-chip bumps 430b serving as contacts. The first conductive lines 110 are formed on a surface 411 of the package substrate 410 but the second conductive lines 120 are formed on a surface 421 of the semiconductor substrate 420 such that the first conductive lines 110 and the second conductive lines 120 are positioned on different levels. Each of the second conductive lines 120 crosses over each of the first conductive lines 110. In some embodiments, the first conductive lines 110 are formed of a material the same as the pads 412 or a pattered metal layer on the package substrate 410. In yet some embodiments, the second conductive lines 120 are formed of a material the same as the UBM layer 422. Each of the flip-chip bumps 430b is electrically interconnected between one of the first conductive lines 110 and one of the second conductive lines 120, and is positioned at the intersection of the one of the first conductive lines 110 and the one of the second conductive lines 120. The flip-chip bumps 430b are arranged in a way such that parts of the first and second conductive lines 110, 120 form an electric current path that serves as an inductor. The arrangement and function of the flip-chip bumps 430b may be similar to these described hereinbefore in connection with the contacts 130.

In some embodiments, a ground ring 160 is provided at the periphery of the inductor 100f. In some embodiments, as shown in FIG. 4A, the ground ring 160 is formed on the surface 411 of the package substrate 410 so that the ground ring 160 and the first conductive lines 110 are positioned at substantially the same level. In some embodiments, the ground ring 160 is coupled to a ground voltage of an electrical circuit (not shown) on the package substrate 410. In some embodiments, the ground ring 160 and the first conductive lines 110 are formed in a same process step, and thus include an identical material according to some examples of the present disclosure.

Figure 4B:
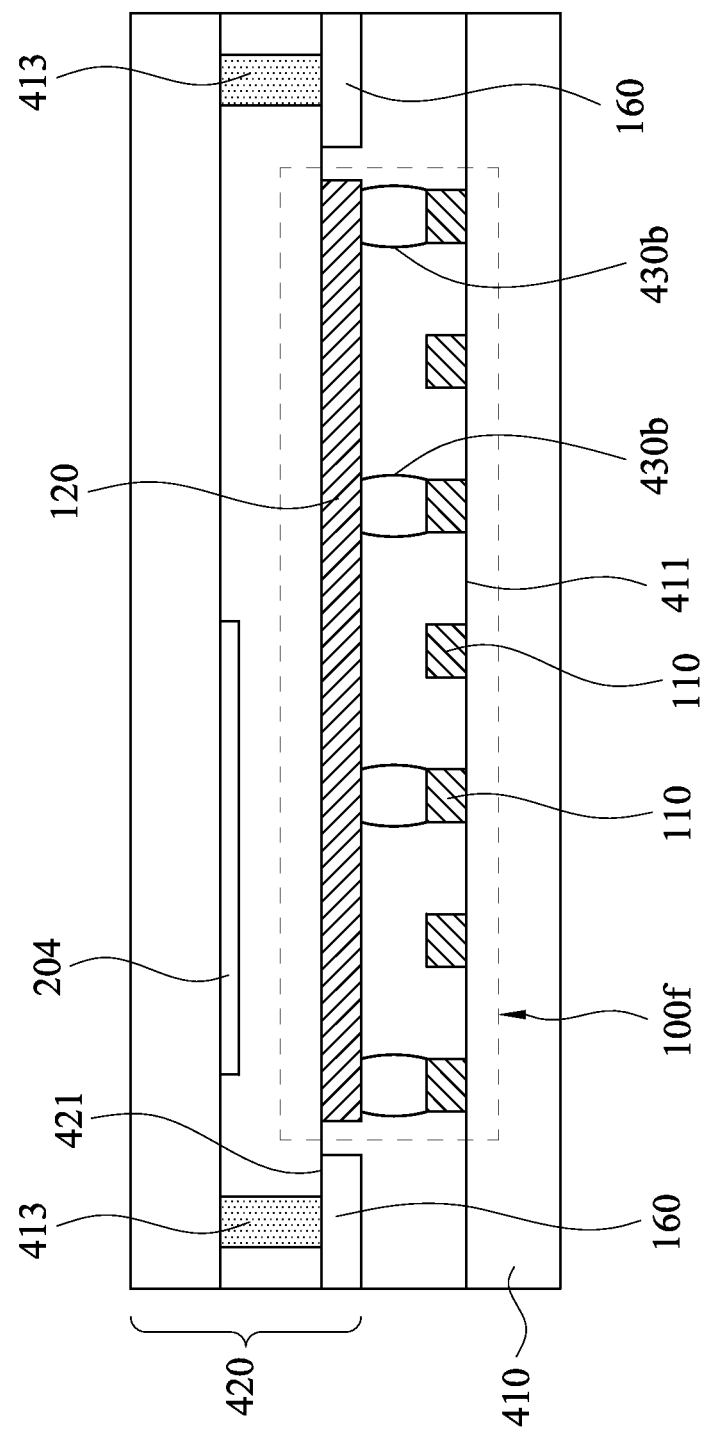

In yet some embodiments, as shown in FIG. 4B, the ground ring 160 is formed on the surface 421 of the semiconductor substrate 420 so that the ground ring 160 and the second conductive lines 120 are position at substantially the same level. In some embodiments, the ground ring 160 is coupled to a ground voltage of the circuitry 204 formed in the semiconductor substrate 420 through one or more via contacts 413 through the passivation layer and/or IMD layer. In some embodiments, the ground ring 160 and the second conductive lines 120 are formed in a same process step, and thus include an identical material according to some examples of the present disclosure. For instance, both the ground ring 160 and the second conductive lines 120 are formed of a material the same as the UBM layer 422 shown in FIG. 4A.

Figure 4C:
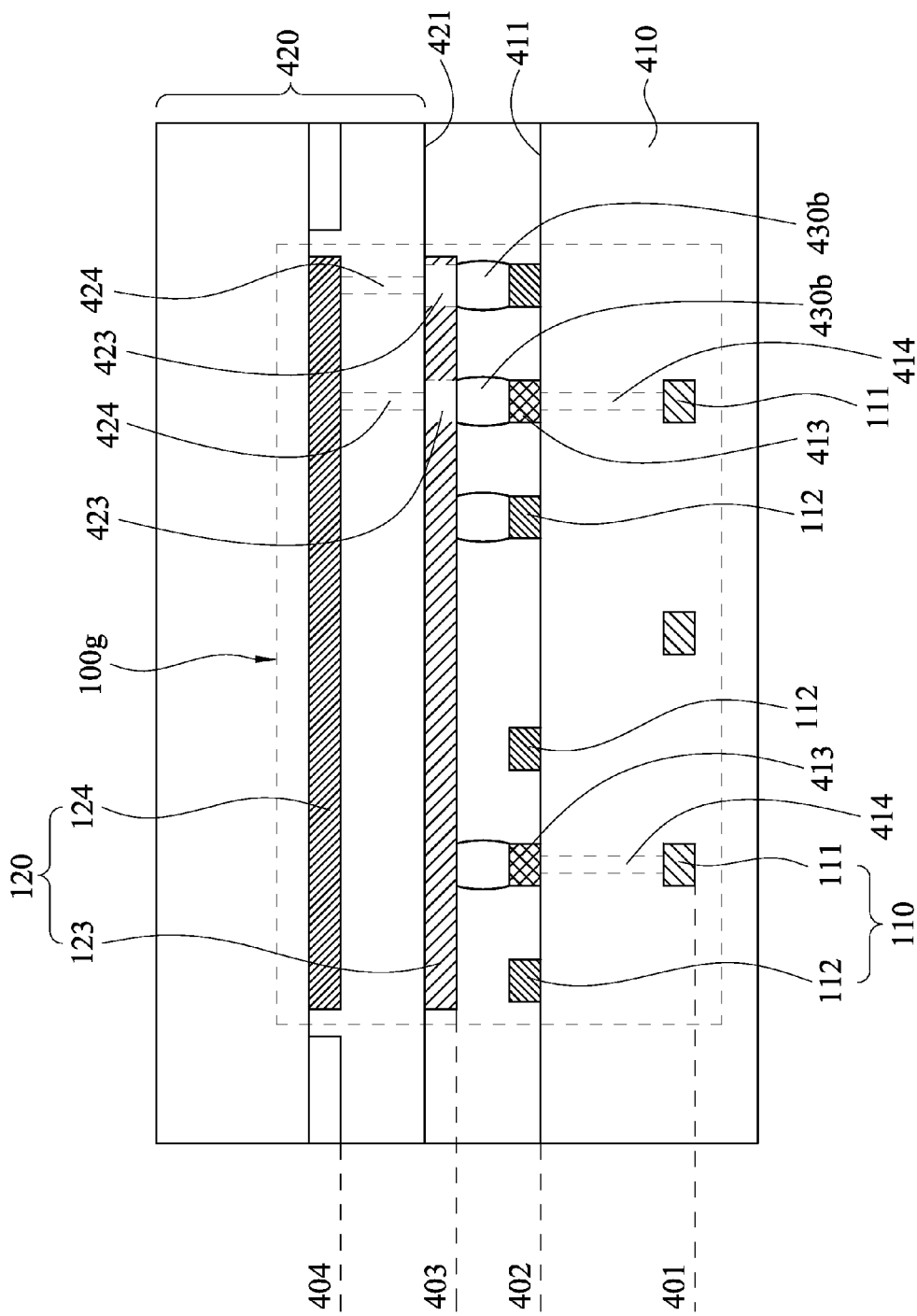

FIG. 4C is a cross-sectional view schematically illustrating an inductor 100g formed in a flip chip package according to various embodiments of the present disclosure. The inductor 100g is similar to the inductor 100f shown in FIG. 4A. Nevertheless, the first conductive lines 110 include a first subset of conductive lines 111 and a second subset of conductive lines 112 formed on the package substrate 410. Furthermore, the second conductive lines 120 include a third subset of conductive lines 123 and a fourth subset of conductive lines 124 formed on the semiconductor substrate 420. The first subset of conductive lines 111 is arranged at a level 401 with respect to a reference surface, such as the surface 411 of the package substrate 410. The second subset of conductive lines 112, the third subset of conductive lines 123 and the fourth subset of conductive lines 124 are respectively arranged at a level 402, a level 403, and a level 404 with respect to the reference surface 411. In some embodiments, the second subset of conductive lines 112 and the third subset of conductive lines 123 are respectively formed on the surface 411 of the package substrate 410 and the surface 421 of the semiconductor substrate 420. One of the conductive lines 112 of the second subset may be electrically connected to one of the conductive lines 123 of the third subset by the flip-chip bumps 430b disposed therebetween.

The package substrate 410 includes a plurality of via contacts 414 and a plurality of pads 413, as shown in FIG. 4C. Each of the pads 413 is provided on the surface 411 of the package substrate 410 at a position overlapped with one of the first subset of conductive lines 111. Furthermore, each of the via contacts 414 electrically interconnects between one of the first subset of conductive lines 111 and one of the pads 413. Therefore, one of the first subset of conductive lines 111 is electrically connected to one of the flip-chip bumps 430b through the pad 413 disposed therebetween.

The semiconductor substrate 420 includes a plurality of via contacts 424 and a plurality of UBM pads 423, as shown in FIG. 4C. Each of the UBM pads 423 is provided on the surface 421 of the semiconductor substrate 420 at a position overlapped with one of the fourth subset of conductive lines 124. In addition, each of the via contacts 424 electrically interconnects between one of the fourth subset of conductive lines 124 and one of the UBM pads 423, and therefore the one of the conductive lines 124 is electrically connected to one of the flip-chip bump 430b through the UBM pad 423 formed therebetween. Accordingly, one of the conductive lines 124 may be electrically connected to any of the first and second subsets of conductive lines 111, 112 through via contact 424, UBM pad 423 and flip-chip bump 430b. Similarly, one of the first subset of conductive lines 111 may be electrically connected to any of the third and fourth subsets of conductive lines 123, 124.

The flip-chip bumps 430b, and the via contacts 414, 424 are arranged in a way such that the parts of the first, second, third and fourth subsets of conductive lines 111, 112, 123, 124 form an electric current path serving as an inductor. The arrangements of the flip-chip bumps 430b and the via contacts 414, 424 may be similar to these described hereinbefore in connection with the FIG. 3A and FIG. 3B.

Figure 5A:
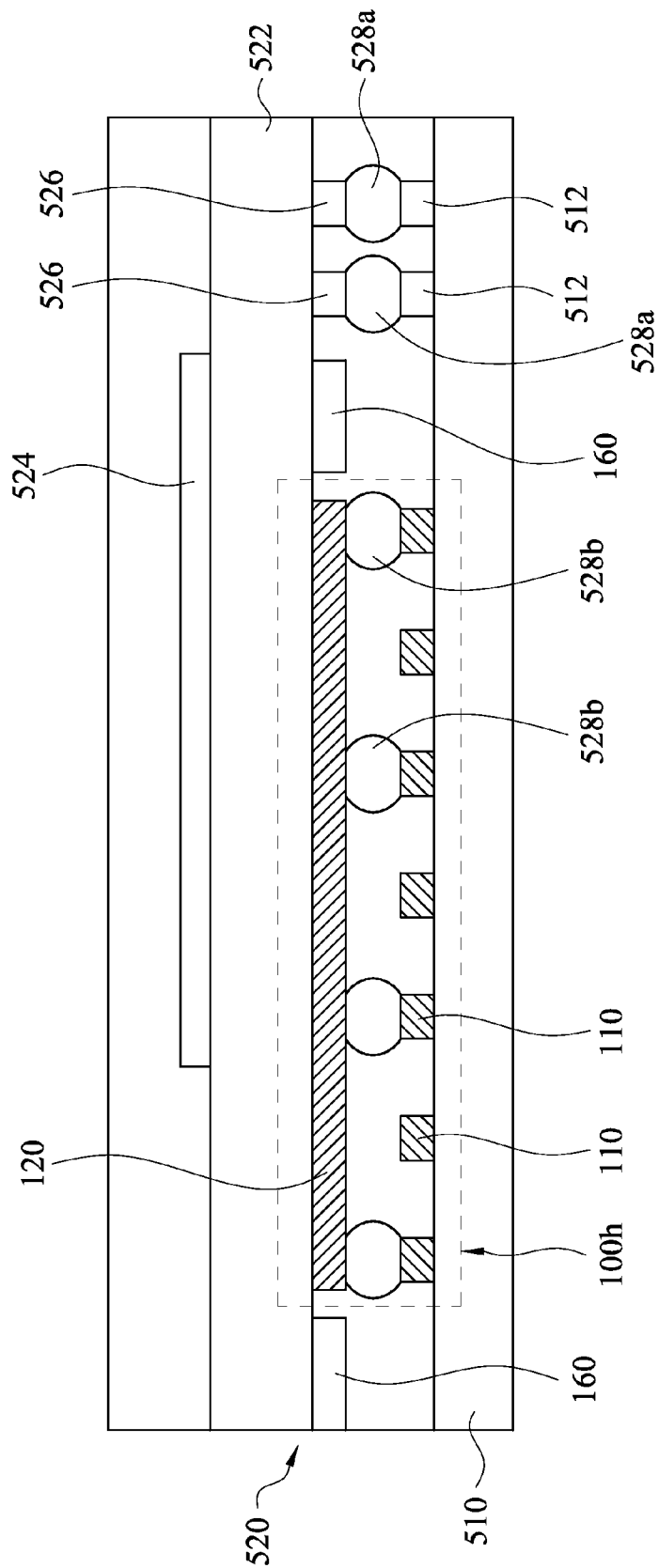
FIG. 5A, FIG. 5B and FIG. 5C are cross-sectional views schematically illustrating inductors formed in assemblies of system circuit boards and ball-grid-array (BGA) package structures according to various embodiments of the present disclosure.

FIG. 5A is a cross-sectional view schematically illustrating an inductor 100h formed in an assembly of a system circuit board 510 and a ball-grid-array (BGA) package structure 520 according to various embodiments of the present disclosure. In some embodiments, the BGA package structure 520 includes an interposer substrate 522, a semiconductor die 524, a plurality of connecting pads 526 and a plurality of solder balls 528a. The semiconductor die 524 and the solder balls 528a are disposed on opposite sides of the interposer substrate 522. Furthermore, the solder balls 528a are disposed on the connecting pads 526. The system circuit board 510 has a plurality of contact pads 512 for connecting with the solder balls 528a. The BGA package structure 520 is electrically connected to the system circuit board 510 through the solder balls 528a.

The top view of the inductor 100h is similar to that depicted in FIG. 1B. Nevertheless, a portion of the inductor 100h is formed on the system circuit board 510 whereas another portion of the inductor 100h is formed on the BGA package structure 520, as shown in FIG. 5A. With reference to FIG. 1B and FIG. 5A, the inductor 100h includes a plurality of first conductive lines 110, a plurality of second conductive lines 120 and a plurality of solder balls 528b serving as contacts. The first conductive lines 110 and the second conductive lines 120 are respectively formed on the system circuit board 510 and the BGA package structure 520 so that the first conductive lines 110 and the second conductive lines 120 are positioned on different levels. Each of the second conductive lines 120 crosses over each of the first conductive lines 110. Each of the solder balls 528b is electrically connected to one of the first conductive lines 110 and one of the second conductive lines 120, and is positioned at an intersection of the one of the first conductive lines 110 and the one of the second conductive lines 120. The solder balls 528b are arranged in a way such that parts of the first and second conductive lines 110, 120 form an electric current path that functions as an inductor. The arrangement and function of the solder balls 528b may be the same as these described hereinbefore in connection with the contacts 130. In some embodiments, the first conductive lines 110 are formed of a material the same as contact pads 512 on the system circuit board 510. In yet some embodiments, the second conductive lines 120 are formed of a material the same as the connecting pads 526 on the BGA package structure 520.

Figure 5B:
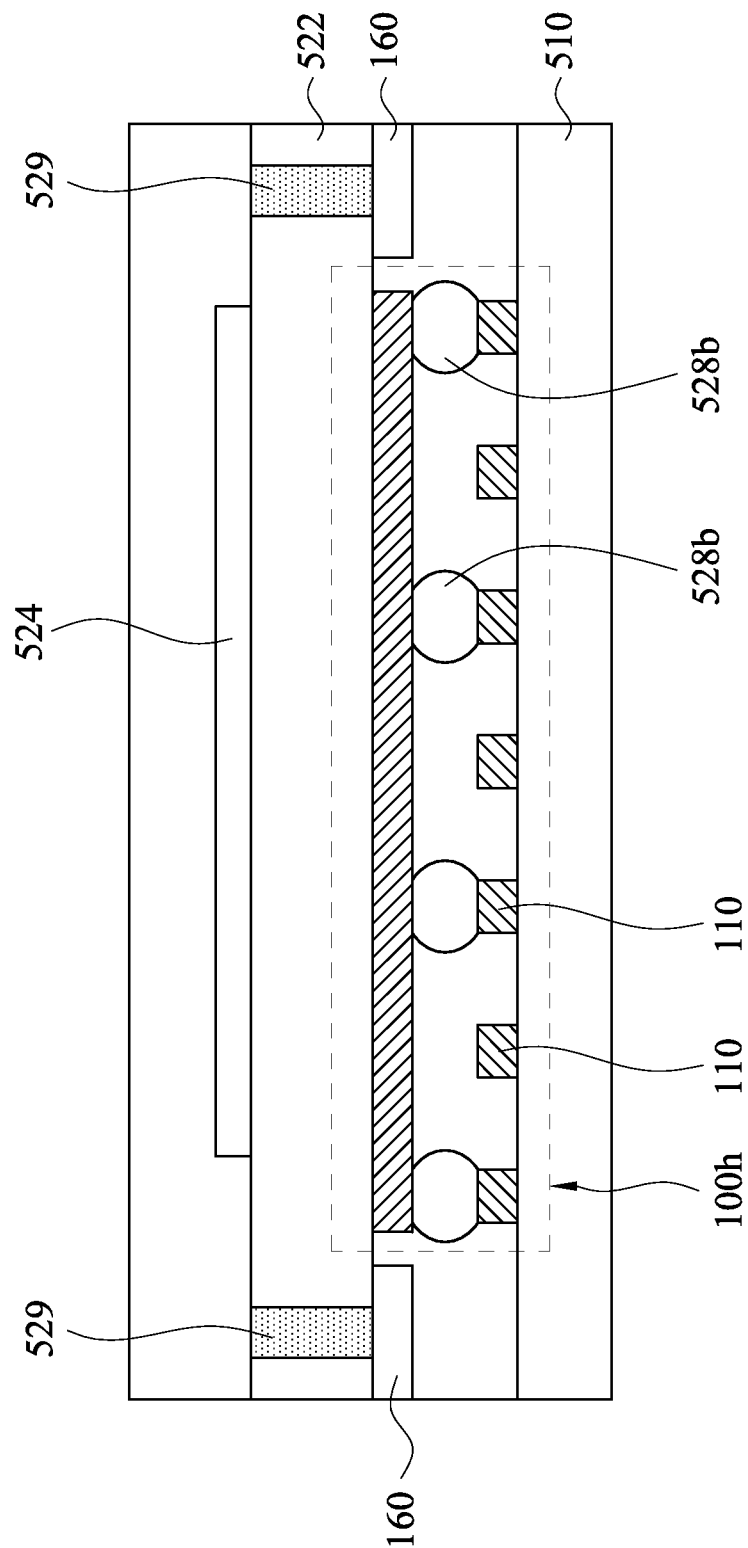

In some embodiments, a ground ring 160 is provided on the interposer substrate 522 at the periphery of the inductor 100h, as shown in FIG. 5A. In some embodiments, the ground ring 160 is formed on the same surface as the second conductive lines 120 such that the ground ring 160 and the second conductive lines 120 are positioned at substantially the same level. In some embodiments, the ground ring 160 is coupled to a ground voltage of an electrical circuit (not shown) formed on the interposer substrate 522. In yet some embodiments, as shown in FIG. 5B, the ground ring 160 is coupled to a ground voltage of the electrical circuitry formed in the semiconductor die 524 through one or more via contacts 529 penetrating through the interposer substrate 522.

Figure 5C:
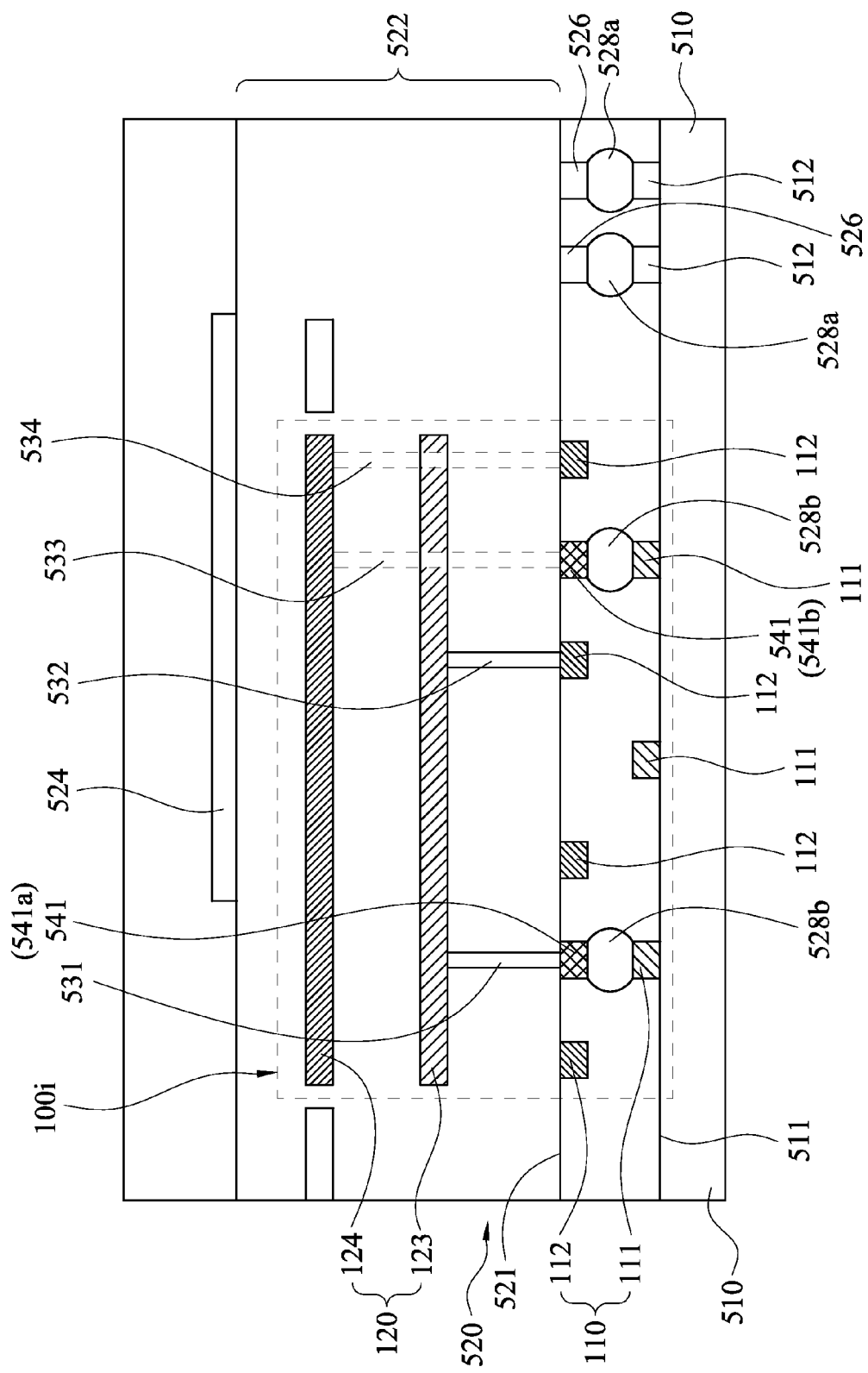

FIG. 5C is a cross-sectional view schematically illustrating an inductor 100i formed in an assembly of a system circuit board 510 and a BGA package structure 520 according to various embodiments of the present disclosure. In some embodiments, the BGA package structure 520 includes an interposer substrate 522, a semiconductor die 524, a plurality of connecting pads 526 and a plurality of solder balls 528a. The semiconductor die 524 and the solder balls 528a are disposed on opposite sides of the interposer substrate 522. The solder balls 528a are disposed on the connecting pads 526. In some embodiments, the system circuit board 510 has a plurality of contact pads 512 for connecting with the solder balls 528a. The BGA package structure 520 may be electrically connected to the system circuit board 510 through the solder balls 528a. As shown in FIG. 5C, a portion of the inductor 100i is formed on the system circuit board 510 whereas another portion of the inductor 100i is formed on the interposer substrate 522 of the BGA package structure 520. The inductor 100i includes a plurality of first conductive lines 110 and a plurality of second conductive lines 120 that cross over the first conductive lines 110.

Referring to FIG. 5C, the first conductive lines 110 include a first subset of conductive lines 111 and a second subset of conductive lines 112. It is noted that the first subset of conductive lines 111 is formed on the surface 511 of the system circuit board 510, but the second subset of conductive lines 112 is formed on the surface 521 of the interposer substrate 522. The second conductive lines 120 include a third subset of conductive lines 123 and a fourth subset of conductive lines 124. The third subset of conductive lines 123 and the fourth subset of conductive lines 124 are positioned at different levels in the interposer substrate 522. The top view of the first, second, third and fourth subsets of conductive lines 111, 112, 123, 124 is similar to that depicted in FIG. 3B.

In some embodiment, the interposer substrate 522 includes a plurality of pads 541 on the surface 521 of interposer substrate 522. Each of the pads 541 is disposed at a position overlapped with one of the first subset of the conductive lines 111. In some embodiments, the interposer substrate 522 further includes at least one via contact 531 that electrically interconnects one of the third subset of the conductive lines 123 with one of the pads 541, such as pad 541*a*. Accordingly, one of the third subset of conductive lines 123 is through the via contact 531 and pad 541*a* electrically connected to the solder ball 528*b* and one of the first subset of the conductive lines 111. In some embodiments, the interposer substrate 522 further includes at least one via contact 532 that electrically interconnects between one of the third subset of the conductive lines 123 and one of the second subset of the conductive lines 112.

In some embodiments, the interposer substrate 522 further includes at least one via contact 533 that electrically interconnects between one of the fourth subset of the conductive lines 124 and one of the pads 541, such as pad 541*b*. Accordingly, one of the fourth subset of the conductive lines 124 is through the via contact 533 and pad 541*b* electrically connected to the solder ball 528*b* and one of the first subset of conductive lines 111. In some embodiments, the interposer substrate 522 further includes at least one via contact 534 that electrically interconnects between one of the fourth subset of the conductive lines 124 and one of the second subset of the conductive lines 112.

The solder balls 528*b*, the pads 541 and the via contacts 531, 532, 533, 534 are arranged in a way such that parts of the conductive lines 111, 112, 123, 124 form an electric current path serving as an inductor. The arrangements of the solder balls 528*b* and the via contacts 531, 532, 533, 534 may be similar to these described hereinbefore in connection with the FIG. 3A and FIG. 3B.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

In accordance with one aspect of some embodiments, an inductor includes a plurality of first conductive lines, a plurality of second conductive lines and a plurality of contacts. The first conductive lines are spaced apart from each other. Furthermore, the second conductive lines are spaced apart from each other, and each of the second conductive lines crosses over each of the first conductive lines. Each of the contacts is electrically connected to one of the first conductive lines and one of the second conductive lines, and is positioned at an intersection of said one of the first conductive lines and said one of the second conductive lines. The contacts are arranged in a way such that at least parts of the first conductive lines and at least parts of the second conductive lines form an electric current path that serves as an inductor.

In accordance with another aspect of some embodiments, an inductor includes a first substrate, a plurality of first conductive lines, a second substrate, a plurality of second conductive lines, and a plurality of bumps. The first conductive lines are formed on the first substrate, and the first conductive lines are spaced apart from each other. The second substrate is disposed above the first substrate. The second conductive lines are formed on the second substrate, and the second conductive lines are spaced apart from each other. The second conductive lines cross over the first conductive lines. The bumps are disposed between the first and second substrates. Each of the bumps is electrically interconnected between one of the first conductive lines and one of the second conductive lines. The bumps are arranged in a way such that at least parts of the first conductive lines and at least parts of the second conductive lines form an inductor.

In accordance with another aspect of some embodiments, an inductor includes a plurality of first conductive lines, a plurality of second conductive lines and a plurality of contacts. The first conductive lines are arranged in parallel. The second conductive lines are arranged in parallel, and the second conductive lines cross over the first conductive lines. Each of the contacts is electrically interconnected one of the first conductive lines with one of the second conductive lines. Each of the first and second conductive lines is in contact with a maximum of two of the contacts. The contacts are arranged in a way such that at least parts of the first conductive lines and at least parts of the second conductive lines form an electric current path serving as an inductor.

What is claimed is:

1. An inductor, comprising:
   a plurality of first conductive lines, each spaced apart from one another;
   a plurality of second conductive lines, wherein each of the second conductive lines is spaced apart from one another, and the plurality of the second conductive lines cross over the plurality of the first conductive lines to constitute a plurality of quadrilateral patterns as viewed from a direction that is perpendicular to directions traversed by the plurality of first and second conductive lines; and
   a plurality of contacts, each electrically connected to one of the first conductive lines and one of the second conductive lines, and each positioned at an intersection of said one of the first conductive lines and said one of the second conductive lines, wherein the contacts are arranged in a way such that at least parts of the first conductive lines and at least parts of the second conductive lines form an electric current path that serves as an inductor.

2. The inductor according to claim 1, wherein the first conductive lines are arranged at a first level, and the second conductive lines are arranged at a second level that is different from the first level.

3. The inductor according to claim 1, wherein each of the first conductive lines extends in a first direction, and each of the second conductive lines extends in a second direction that crosses the first direction.

4. The inductor according to claim 1, wherein the first conductive lines and the second conductive lines are formed in a post-passivation interconnect (PPI) structure of a semiconductor substrate.

5. The inductor according to claim 1, wherein the first conductive lines are parallel with each other, and the second conductive lines are parallel with each other.

6. The inductor according to claim 1, wherein each of the first conductive lines has a substantially identical width.

7. The inductor according to claim 1, wherein each of the second conductive lines has a substantially identical width.

8. The inductor according to claim 1, wherein the first conductive lines are arranged at an equal interval, and the second conductive lines are arranged at an equal interval.

9. The inductor according to claim 8, wherein the interval between adjacent ones of the first conductive lines equals the interval between adjacent ones of the second conductive lines.

10. The inductor according to claim 1, wherein each of the first conductive lines is orthogonal to each of the second conductive lines.

11. The inductor according to claim 1, wherein the electric current path passes alternately through one of the first conductive lines and one of second conductive lines.

12. The inductor according to claim 1, wherein the plurality of the first conductive lines comprise a first subset of conductive lines arranged at a first level and a second subset of conductive lines arranged at a second level that differs from the first level, and the conductive lines of the first and second subsets are substantially parallel to each other.

13. The inductor according to claim 1, wherein the plurality of the second conductive lines comprise a third subset of conductive lines arranged on a third level and a fourth subset of conductive lines arranged on a fourth level that differs from the third level, and the conductive lines of the third and fourth subsets are substantially parallel to each other.

14. The inductor according to claim 1, wherein the first conductive lines are formed on a semiconductor substrate, the second conductive lines are formed on a surface of packaging substrate, and the contacts include a plurality of flip-chip bumps formed between the semiconductor substrate and the packaging substrate.

15. The inductor according to claim 1, wherein the first conductive lines are formed on an interposer substrate, the second conductive lines are formed on a system circuit board, and the contacts are a plurality of solder balls of a ball grid array (BGA) formed between the interposer substrate and the system circuit board.

16. An inductor, comprising:
a first substrate;
a plurality of first conductive lines formed on the first substrate, each of the first conductive lines being spaced apart from one another;
a second substrate disposed above the first substrate;
a plurality of second conductive lines formed on the second substrate, wherein each of the second conductive lines is spaced apart from another one of the second conductive lines, and the plurality of the second conductive lines cross over the plurality of the first conductive lines to constitute a plurality of quadrilateral patterns as viewed from a direction that is perpendicular to directions traversed by the plurality of first and second conductive lines; and
a plurality of bumps disposed between the first and second substrates, each of the bumps being electrically interconnected between one of the first conductive lines and one of the second conductive lines, wherein the plurality of the bumps are arranged in a way such that at least parts of the first conductive lines and at least parts of the second conductive lines form an inductor.

17. The inductor according to claim 16, wherein the first and second substrates are respectively a package substrate and a flip chip.

18. The inductor according to claim 16, wherein the first and second substrates are respectively a system circuit board and a ball-grid-array (BGA) package structure.

19. An inductor, comprising:
a plurality of first conductive lines arranged in parallel;
a plurality of second conductive lines arranged in parallel, the plurality of the second conductive lines crossing over the plurality of the first conductive lines so to form a plurality of quadrilateral patterns as viewed from a direction that is perpendicular to directions traversed by the plurality of first and second conductive lines, and
a plurality of contacts, each electrically interconnected one of the first conductive lines with one of the second conductive lines, wherein each of the first and second conductive lines is in contact with a maximum of two of the contacts, and the plurality of the contacts are arranged in a way such that at least parts of the first conductive lines and at least parts of the second conductive lines form an electric current path serving as an inductor.

20. The inductor according to claim 19, wherein the contacts comprise any of a via contact, a flip-chip bump and a solder ball.

* * * * *